United States Patent [19]

Dierschke

[11] 4,037,241
[45] July 19, 1977

[54] SHAPED EMITTERS WITH BURIED-JUNCTION STRUCTURE

[75] Inventor: Eugene Gustav Dierschke, Dallas, Tex.

[73] Assignee: Texas Instruments Incorporated, Dallas, Tex.

[21] Appl. No.: 618,978

[22] Filed: Oct. 2, 1975

[51] Int. Cl.² .............................................. H01L 33/00
[52] U.S. Cl. ........................................ 357/17; 357/89; 357/55
[58] Field of Search ....................... 357/16, 17, 18, 89, 357/55; 331/94.5 H

[56] References Cited

U.S. PATENT DOCUMENTS

| 3,780,358 | 12/1973 | Thompson | 357/16 |
|---|---|---|---|
| 3,783,351 | 1/1974 | Tsukada et al. | 357/16 |
| 3,915,765 | 10/1975 | Cho et al. | 357/16 |
| 3,936,855 | 2/1976 | Goell et al. | 357/16 |

OTHER PUBLICATIONS

Potemski et al., "Method for Making Hemispheres", *IBM Technical Disclosure Bulletin*, vol. 15, No. 1, June 1972, pp. 147-148.
Susaki et al., "A New Geometry Double-Heterostructure Injection Laser for Room-Temperature Continuous Operation; Junction-Stripe-Geometry DH Lasers," *J. Appl. Phys.*, vol. 44, No. 6, June 1973, pp. 2893-2894.
Ikeda et al. "GaAs-(Ga,Al)As Double Heterostructure Light Emitting Diode", *IEE Transactions on Electron Devices,* Sept. 1975, pp. 799-801.

*Primary Examiner*—Michael J. Lynch
*Assistant Examiner*—James W. Davie
*Attorney, Agent, or Firm*—Harold Levine; James T. Comfort; Gary C. Honeycutt

[57] ABSTRACT

Disclosed is a radiation emitting diode in which a first layer of N-type GaAs and a second layer of N-type GaAlAs are formed on an N-type GaAs substrate. A localized zinc diffused region extends through the second layer and partially into the first layer to form a buried junction. Because of the higher bandgap energy of GaAlAs than of GaAs, the current density in the GaAlAs portion of the p-n junction is greatly reduced compared to that in the GaAs portion and the nonradiative surface components of current are greatly reduced. This results in a buried junction structure in which the radiation emitting region is removed from the surface. The buried junction structure provides devices having improved linearity of the radiant output power versus current characteristics and reduced degradation of radiant output power at constant current with time.

6 Claims, 6 Drawing Figures

SHAPED EMITTERS WITH BURIED-JUNCTION STRUCTURE

FIELD OF THE INVENTION

This disclosed invention relates to radiation emitting devices and more particularly to an improved device with a buried radiation emitting junction.

BACKGROUND OF THE INVENTION

Three principal factors limit the efficiency of radiation emitting diodes. These factors are: non-radiative components of current, absorption of the generated radiation in the semiconductor material before emission, and total internal reflection at the semiconductor-air interface. The last two effects can be minimized separately but it is different to minimize both simultaneously.

The total diode current consists of several parallel components. Each current component depends on the applied junction voltage V as exp $[(qV-E)/nkT]$ where $q$ is the electron charge, E is the bandgap energy, $k$ is Boltzman constant, T is the temperature, and $n$ is a constant. Radiation in infrared emitting diodes results from the radiative recombination of electrons injected across the p-n junction from the N-type material into the P-type material, for the radiative component of current, $n = 1$. In parallel are non-radiative components of current ($n = 2$) due to recombination in the space charge region or due to surface recombination. By the use of high quality semiconductor material, the space charge recombination current can be minimized. The principal non-radiative component of current is due to surface recombination.

The result of the non-radiative component of current is non-linearity of the radiant power versus current characteristic. The efficiency of the emitter decreases rapidly at low currents. The degradation of radiant output power versus time at constant current is principally due to an increase in the non-radiative component of current.

One of the principal features of the invention is the use of a multi-layer structure in which the material at the surface has a higher bandgap energy than the material in the interior of the device. One effect of this feature is to greatly reduce the non-radiative component of current due to surface recombination and results in improved linearity and reduced degradation. An application in which the improved emitter linearity results in improved systems performance due to decreased distortion is the analog transmission of information in which the intensity of the emitted radiation is modulated by varying the diode current.

The geometric design of infrared emitting diodes is very important for maximum device efficiency. The high index of refraction of GaAs ($n_s = 3.6$) compared to that of air ($n_a = 1.0$) results in a large refraction of rays at the semiconductor-air interface for rays which are not normal to the interface. For flat geometry devices, this large index mismatch severely limits the amount of light which can be obtained from the device.

The basic law of optics which governs the coupling of rays between media of different indices and Snell's law of refraction given by $$n_a \sin\theta_a = n_s \sin\theta_s$$

Where $\theta$ is the angle measured from the normal to the interface. The angle $\theta_s$ is the incident angle in the semiconductor. The angle $\theta_a$ is the refracted angle in the air. For small incident angles, the rays will be refracted at the interface. For angles greater than critical angle $(\theta_s)_c$, the total internal reflection of the rays occur. The critical angle for this case is given by $$\sin(\theta_s)_c = n_a/n_s$$

For $n_a = 1.0$ and $n_s = 3.6$, the critical angle is equal to 16.1°. Thus only rays within an emission cone with a half angle of 16.1° = can be emitted through the top of a flat emitter.

For spontaneous emitters, the generated radiation in the device is isotropic. The radiant intensity (W/steradian) in the device, $I_s$, is given by the total generated power $P_g$ divided by the total solid angle. Thus, $$I_s = P_g/4\pi$$

The normal radiant intensity outside a flat geometry emitter is given by $$(I_a)_n = I_s (n_a/n_s)^2$$

Thus, the radiant intensity normal to the flat device is decreased by a factor of 13 compared to the value inside the device. Also, less than 2% of the total generated radiation can be emitted directly from the top surface of a flat geometry emitter, assuming no reflection from the back contact.

Shaped emitters can be used to eliminate total internal reflections. All rays are incident approximately normal to the semiconductor-air interface for a hemispherical emitter with a small junction diameter. For a hemispherical emitter with no reflection from the back contact, ideally 50% of the generated radiation could be emitted from the device. The normal radiant intensity would be a factor of 13 higher than for the flat geometry emitter.

A truncated spherical (Weierstrass) emitter can be used to actually take advantage of the high refraction at the semiconductor-air interface to help focus the rays along the axis normal to the device, thereby greatly increasing the radiant intensity. Ideally, the average radiant intensity of the truncated spherical emitter can be ten times that of the hemisphere or 130 times that of the flat emitter. However, the finite junction size limits the improvement to about four to seven times improvement compared to the hemispherical emitter. One of the features of the invention is to enable the use of smaller junction diameters and to maximize the amount of power generated near the principal axis of the shaped emitter. These features will maximize the advantages of using the truncated spherical emitter to help collimate the emitted radiation and to increase the radiant intensity.

Another major factor which limits device efficiency is absorption of the generated radiation before being emitted from the device. The spectrum of the generated radiation in the GaAs emitter is near the absorption edge of the GaAs material. Thus, much of high energy radiation is normally absorbed in the GaAs material. The absorption in shaped emitters due to the large path lengths causes the shaped emitters to exhibit less than theoretical improvements compared to the flat emitters. However, the gain achieved with the hemispherical shape exceeds the loss due to absorption, thus resulting in an overall net increase in total output power and normal radiant intensity.

For some applications such as for coupling to small diameter single optical fibers, the total power output and normal radiant intensity is not as important as the value of the radiance. The radiance can be maximized by decreasing the absorption. For small-area, high-radiance emitters, the device is generally mounted P-side down for decreased thermal resistance. The radiation is then emitted through the N-type substrate. One approach to reduce absorption is to etch a well in the back of a flat geometry emitter to greatly reduce the thickness of the GaAs through which the radiation is transmitted. This device design is called the etched-well emitter. Several features of the invention can give improved performance for this type emitter.

SUMMARY OF THE INVENTION

The invention relates to the design of radiation emitting diodes wherein a multi-layer, multi-bandgap-energy structure is combined with a localized diffusion to achieve a "buried-junction" structure in which the primary radiation generation region is isolated from the surface and in which surface effects on the diode characteristics are greatly reduced. This structure with various geometrical device designs results in emitters superior to present devices.

Two liquid phase epitaxial layers are grown on an N-type GaAs substrate. The first epitaxial layer is N-type GaAs and the second layer is N-type GaAlAs. The GaAlAs has a higher bandgap energy than the GaAs. A localized P-type zinc emitter region is diffused through the second layer and partially into the first layer. The current density in any portion of the p-n junction varies approximately exponentially as $\exp[(qV-E)/nkT]$ where $q$ is the charge of an electron, $V$ is the junction voltage, $E$ is the semiconductor bandgap energy, $k$ is Boltzmann's constant, $T$ is the temperature, and $n$ is a constant equal to 1 for the radiative component of current and equal to 2 for the non-radiative components of current. For a certain junction voltage, the current density in the GaAs portion of the p-n junction will be much greater than the current density in the GaAlAs portion of the p-n junction since the bandgap energy of GaAlAs is larger than that of GaAs. Essentially all the current will flow through the GaAs portion of the junction, removed from the surface of the device. Also, because the material at the intersection of the p-n junction with the surface is higher bandgap energy GaAlAs, any non-radiative surface components ($n = 2$) of current are greatly reduced. Since the primary radiation generation region is removed from proximity of the surface and since the non-radiative current components are reduced, the device design is called a "buried-junction" structure.

Several embodiments of the invention are described herein illustrating how the technical advance represented by this invention may be embodied in several configurations. The advantages and technical features of the present invention will become apparent from the following detailed description taken in conjunction with the accompanying drawings in which.

Figure 1:
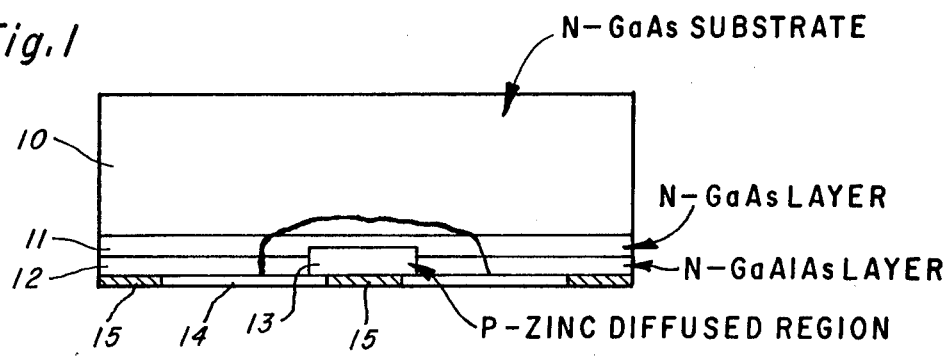
FIG. 1 is one embodiment of the invention illustrating a flat geometry emitter with a buried junction structure.

A device according to the invention is illustrated in FIG. 1. This is a flat geometry emitter with a buried junction structure. The N-type GaAs substrate 10 has two liquid phase epitaxial layers grown thereon. The first layer 11 is N-type GaAs. The second layer 12 is N-type GaAlAs. A zinc diffusion is then made to form a localized P-type region 13. The zinc diffused region 13 extends completely through the second layer 12 and partially into the first layer 11. The localized diffusion is obtained by diffusing through holes in SiN/SiO diffusion mask 14. After diffusion, ohmic contacts 15 are formed on the N-type and P-type material.

Figure 2:
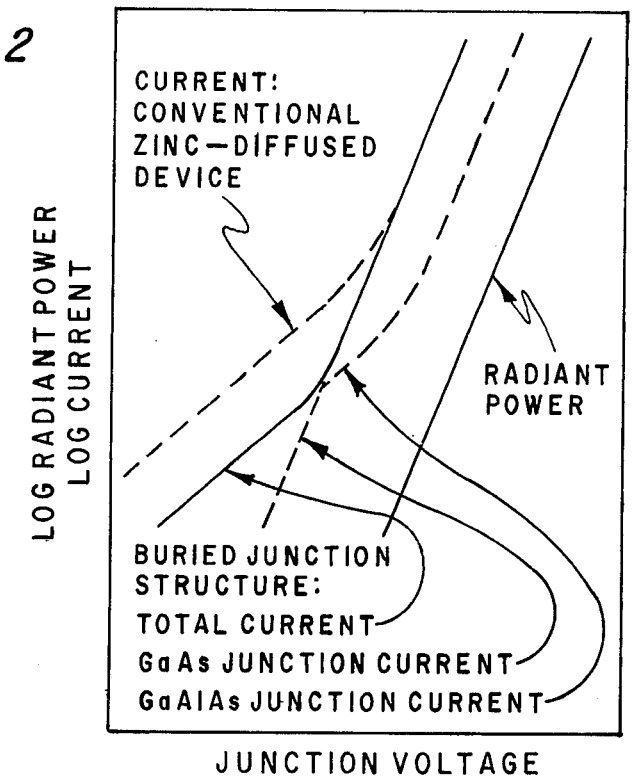
FIG. 2 is a plot of the voltage dependence of current and optical power for emitters with and without the buried junction structure.
Figure 3:
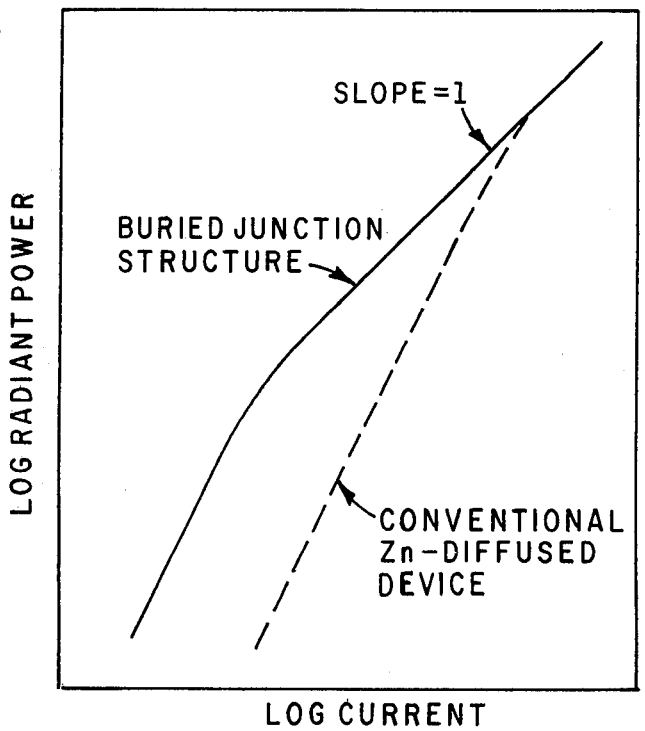
FIG. 3 is a plot of the optical power versus current for a buried junction structure versus a conventional zinc diffused junction.

The second layer 12 which is GaAlAs has a higher bandgap energy than the first GaAs layer. Thus, there are effectively two diodes in parallel, one with characteristics determined by the p-n junction in the GaAs epitaxial layer and the other with characteristics determined by the p-n junction in the GaAlAs epitaxial layer. The expected junction characteristics are shown in FIG. 2. The radiant power and the current components will vary as $\exp[(qV-E)/nkT]$. For the radiative component of current, $n = 1$. Since the GaAs portion of the junction is isolated from the surface, it will not have a non-radiative ($n = 2$) component of current. The GaAlAs portion of the junction will have a non-radiative ($n = 2$) component of current due to surface recombination in addition to the radiative ($n = 1$) component of current, but the characteristic will be shifted to higher voltages due to the higher bandgap energy of GaAlAs. The total current voltage characteristic for the buried-junction structure is shown in FIG. 2. The current-voltage characteristic for a similar zinc diffused emitter without the buried-junction structure is also shown in FIG. 2. The resulting radiant power versus current characteristic is shown in FIG. 3 for a device with the buried junction structure. Also shown in FIG. 3 is the radiant power versus current characteristics for a conventional zinc diffused emitter without the buried-junction structure.

An important advantage of the buried-junction structure is the greatly improved linearity which is observed between the radiant power and current. For analog optical communication applications, the improved linearity results in reduced distortion. For low current operation of the emitters, the reduction of the non-radiative component of current results in significant improvements in overall device optical efficiency.

An important potential advantage of the buried junction structure is greatly reduced degradation of radiant power at constant current as a function of time. Radiation emitting diodes generally degrade because of an increase of the non-radiative ($n = 2$) component of current. Also, the rate of degradation depends strongly on the applied current or voltage stress. Since the buried-junction structure greatly reduces the initial nonradiative component of current and reduces the effect of the surface, this structure should lead to reduced degradation.

The basic buried-junction structure can be achieved by growing a single N-type GaAlAs epitaxial layer on an N-type GaAs substrate and locally zinc diffusing through the GaAlAs layer into the GaAs substrate to form the p-n junction. The advantage of growing a separate N-type GaAs layer is to achieve higher internal and external efficiencies, to achieve faster rise times and to improve reproducibility and uniformity. Conventional emitters use relatively lightly doped N-type material because of the much higher absorption for very heavily doped material. The use of a thin GaAs epitaxial layer enables the junction to be in heavily doped material for increased internal efficiency and increased device speed. The radiative lifetime generally decreases at high doping concentrations. The higher doping should also shift the generation spectrum to slightly lower energy and thus result in reduced absorption in the emitter. The use of a separately grown layer also increases the reproducibility and uniformity of the device characteristics since the quality and characteristics of GaAs substrates vary from ingot to ingot and from slice to slice in an ingot.

The buried-junction structure illustrated in FIG. 1 can also be used in edge emitting devices in which the primary radiation is taken from the sides of the emitter instead of from the top surface of the emitter. The buried junction structure can also be used for emitters in which the radiation is taken through the P-type zinc diffused region instead of through the N-type GaAs substrate.

Figure 4:
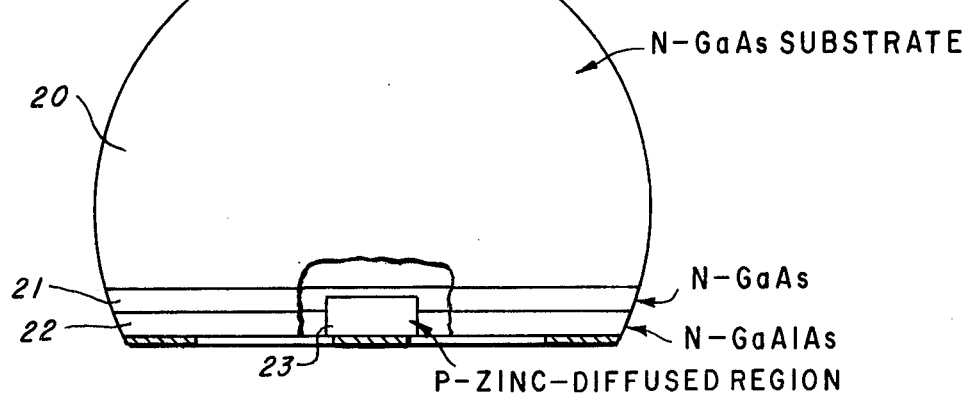
FIG. 4 is another embodiment of the invention illustrating the buried junction structure incorporated into a GaAs truncated spherical emitter.

Another embodiment of the invention is illustrated in FIG. 4 in which the buried junction structure is incorporated into an emitter which has a truncated spherical shape. In this design there are two liquid phase epitaxial layers 21 and 22. Layer 21 is an N-type GaAs layer and is formed on an N-type GaAs substrate 20. The second layer 21 is an N-type GaAlAs layer. Then a P-type zinc diffused region 23 is formed which extends through the GaAlAs layer into the GaAs layer. Thereafter, the material is shaped into a truncated spherical emitter. The emitter has the buried-junction structure for improved linearity, potentially reduced degradation, higher efficiency, and faster rise times as discussed earlier.

In addition, the buried-junction structure should give improved radiation pattern characteristics. For optimum focusing of the emitted radiation by the truncated spherical emitter, a small generation region is desired in the center of the base. For small junction diameters in the conventional shaped emitter much of the current flows in portions of the junction perpendicular to the emitter base. The light which is generated is far from the center of the base and thus will not couple out of the device as well as for rays generated near the center. The buried-junction structure eliminates most of the current in the side portions of the junction and most of the current will flow in the portion of the junction which is parallel to the device base. In this matter a small diameter generation region near the center of the base is achieved.

Figure 5:
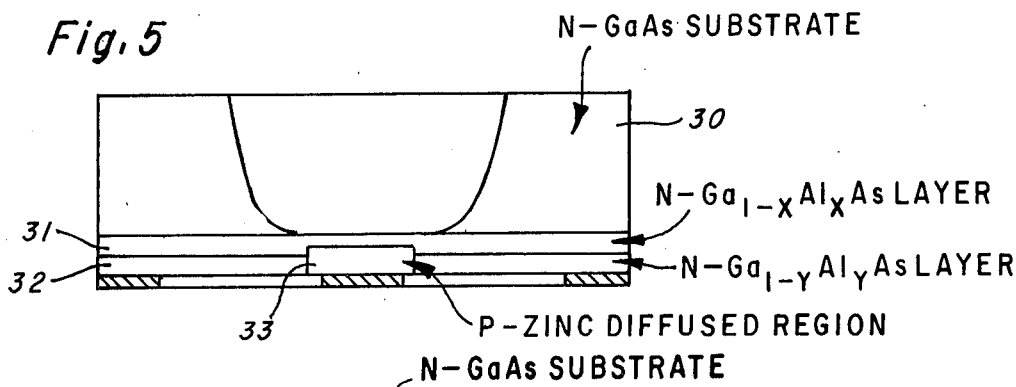
FIG. 5 is an embodiment of the invention illustrating the buried junction structure incorporated into a GaAlAs etched well emitter.

Another embodiment of the invention is illustrated in FIG. 5 in which the buried-junction structure is incorporated into an emitter which has an etched well for improved transmission. In this design there are two liquid phase epitaxial layers 31 and 32. Layer 31 is an N-type GaAlAs layer and is formed on an N-type GaAs substrate 30. The second layer 32 is an N-type GaAlAs layer with a higher concentration of AlAs so that the bandgap energy of second layer is greater than that of the first layer. Thereafter, a P-type zinc diffused region 33 is formed which extends through the second GaAlAs layer into the first GaAlAs layer. Thus, the buried-junction structure is achieved with the advantages discussed earlier. Since the p-n junction is in GaAlAs, radiation emission energy higher than that in GaAs can be achieved. A well is etched in the back of the device to remove the absorbing GaAs substrate. The buried-junction structure results in a small-area, high-radiance, uniform emitting source.

Figure 6:
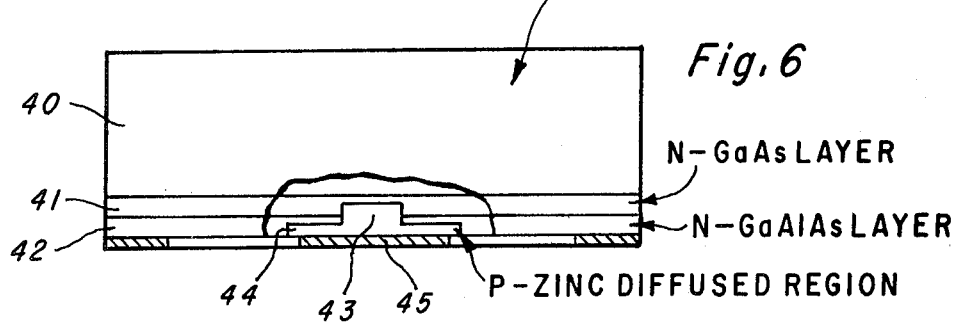
FIG. 6 is an embodiment of the invention illustrating the buried junction structure incorporated into a flat geometry emitter but modified from that shown in FIG. 1.

Another embodiment of the invention is illustrated in FIG. 6. In this embodiment, a N-type GaAs layer 41 is deposited on a GaAs substrate 40. Then a N-type GaAlAs layer 42 is deposited on the GaAs layer. Thereafter, a P-type zinc diffused region is formed. In the center portion 43, the zinc diffused region extends through the GaAlAs layer into the GaAs layer. In the outer portion 44, the zinc diffused region remains in the GaAlAs layer. The multi-dip junction can be obtained by diffusion through different thicknesses of silicon oxide or by a double diffusion.

One of the limiting factors in the minimum size of the emitting area and the maximum current is heating of the junction. Most of the generated heat is conducted from the junction to the heatsink through the P-contact. For the conventional type emitter, the contact has to be smaller than the emitting area. This limits heat transfer. However, with the buried-junction structure shown in FIG. 6, the ohmic contact 45 to the P-type region 44 can be made much larger than the emitting area.

Although the novel features of this invention have been described and illustrated in the form of four distinct embodiments, it is understood that the buried-junction structure can be utilized in many configurations of radiation emitting devices. In addition, the buried-junction structure can be utilized using other material systems for which heterostructure layers of different bandgap energies can be grown. In addition, the buried-junction structure can be utilized to reduce surface effects in applications in which the p-n junction is used as an optical detector of radiation instead of as an optical generator of radiation.

I claim:

1. A light emitting semiconductor device comprising a monocrystalline III-V compound substrate having a first surface layer of n-type III-V material thereon, said first layer having a first bandgap energy;

a second layer of n-type III-V material covering said first layer, said second layer having a higher bandgap energy than said first layer;

a p-type region within said first and second layers extending from the surface of said second layer completely through the thickness of said second layer and only partially through the thickness of said first layer, thereby forming a light emitting pn junction;

said p-type region being wholly surrounded at the surface by said second n-type surface layer and having a stepped geometry such that the area of said pn junction within said first n-type layer is substantially smaller than the area of said pn junction within said second n-type layer; and means forming an ohmic contact with said p-type region, said means having an area of contact with said p-type region, said area of contact being substantially larger than the area of said pn junction confined within said first n-type surface layer.

2. The device according to claim 1 wherein the substrate is GaAs and said first layer formed on the substrate is GaAlAs.

3. The device according to claim 1 wherein the P-type region is a zinc diffused P-region.

4. The device according to claim 1 wherein the substrate is GaAs, the first of the two layers is GaAs and the second layer is GaAlAs.

5. The device according to claim 1 wherein the substrate is shaped to form a focusing lens for the device.

6. The device according to claim 1 wherein the substrate is etched away from the radiation path of said light emitting junction.

* * * * *